(12) United States Patent
Tiew

(10) Patent No.: US 9,837,999 B2
(45) Date of Patent: Dec. 5, 2017

(54) ELECTRONIC DEVICE WITH SUBSTRATE CURRENT MANAGEMENT

(71) Applicant: Monolithic Power Systems, Inc., San Jose, CA (US)

(72) Inventor: Kee Chee Tiew, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/092,523

(22) Filed: Apr. 6, 2016

(65) Prior Publication Data

US 2017/0294902 A1   Oct. 12, 2017

(51) Int. Cl.
*H03L 5/00* (2006.01)
*H03K 5/08* (2006.01)
*H01L 29/872* (2006.01)

(52) U.S. Cl.
CPC .............. *H03K 5/08* (2013.01); *H01L 29/872* (2013.01)

(58) Field of Classification Search
CPC ....... H01L 2924/00; H01L 2924/00014; H01L 2224/48247; H01L 2224/49175; H01L 2224/48091
See application file for complete search history.

(56) References Cited

U.S. PATENT DOCUMENTS 4,903,189 A * 2/1990 Ngo .................... H01L 29/7722
257/331
2010/0148718 A1* 6/2010 Kitabatake ............. H01L 23/62
318/798

* cited by examiner

*Primary Examiner* — Sibin Chen
(74) *Attorney, Agent, or Firm* — Perkins Coie LLP

(57) ABSTRACT

An electronic device with substrate current management. The electronic device has a semiconductor substrate in which a Schottky diode is formed. A parasitic PN diode is also formed in the semiconductor substrate, and coexisted with the Schottky diode in parallel. The forward voltage of the Schottky diode is limited to be larger than the forward conduction threshold voltage of the Schottky diode and to be smaller than the forward conduction threshold voltage of the parasitic PN diode.

11 Claims, 5 Drawing Sheets

ELECTRONIC DEVICE WITH SUBSTRATE CURRENT MANAGEMENT

TECHNICAL FIELD

The present invention generally relates to electronic circuit, and more particularly but not exclusively relates to an electronic device with substrate current management.

BACKGROUND

In most high-integrated Integrated Circuits (ICs) application, Schottky diodes are usually integrated with transistors, control circuits and/or other elements in a single semiconductor substrate. However, the implementation of these Schottky diodes in a monolithic solution is not straightforward for it imposes several technology restrictions. For example, parasitic bipolar junction transistors (BJT) may be formed in the semiconductor substrate due to the existing of these Schottky diodes. At a high forward current, the parasitic BJT may be turned on resulting that carriers may be injected into the semiconductor substrate if not controlled properly, which may cause these Schottky diodes having a latch up and disturb the operation of other transistors and/or control circuits that are integrated with these Schottky diodes.

SUMMARY

Embodiments of the present invention are directed to an electronic device with substrate current management. The electronic device comprises: a semiconductor substrate; a Schottky diode formed in the semiconductor substrate; a parasitic PN diode formed in the semiconductor substrate; and a voltage limit circuit configured to limit forward voltage of the Schottky diode between a forward conduction threshold voltage of the Schottky diode and a forward conduction threshold voltage of the parasitic PN diode.

Embodiments of the present invention are further directed to another electronic device with substrate current management. The electronic device comprises: a semiconductor substrate; a first Schottky diode formed in the semiconductor substrate; a second Schottky diode formed in the semiconductor substrate; a first parasitic PN diode formed in the semiconductor substrate; a second parasitic PN diode formed in the semiconductor substrate; and a control circuit configured to limit a forward voltage of the first Schottky diode to be larger than a forward conduction threshold voltage of the first Schottky diode and to be smaller than a forward conduction threshold voltage of the first parasitic PN diode, and also configured to limit a forward voltage of the second Schottky diode to be larger than a forward conduction threshold voltage of the second Schottky diode and to be smaller than a forward conduction threshold voltage of the second parasitic PN diode.

Embodiments of the present invention are further directed to a method for eliminating a substrate injection current of an electronic device. The electronic device comprises a Schottky diode and a parasitic PN diode formed in a semiconductor substrate. The method comprises: sensing a forward voltage of each of the at least one Schottky diode; and limiting the forward voltage of the Schottky diode to be larger than a forward conduction threshold voltage of the Schottky diode, and to be smaller than a forward conduction threshold voltage of the parasitic PN diode.

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiment, and the same reference label in different drawings have the same, similar or corresponding features or functions.

DETAILED DESCRIPTION

The embodiments of the present invention are described in next. While the invention will be described in conjunction with various embodiments, it will be understood that this disclosure is not intended to limit the invention to these embodiments. On contrary, the invention is intended to cover alternatives, modifications and equivalents, which may be included within the spirit and scope of the invention as defined by the appended claims. Furthermore, in the following detailed description of the embodiments of the present invention, numerous specific details are set forth in order to provide a thorough understanding of the embodiments of the present invention. However, it will be obvious to one of ordinary skill in the art that without these specific details the embodiments of the present invention may be practiced. In other instance, well-know circuits, materials, and methods have not been described in detail so as not to unnecessarily obscure aspect of the embodiments of the present invention.

Figure 1:
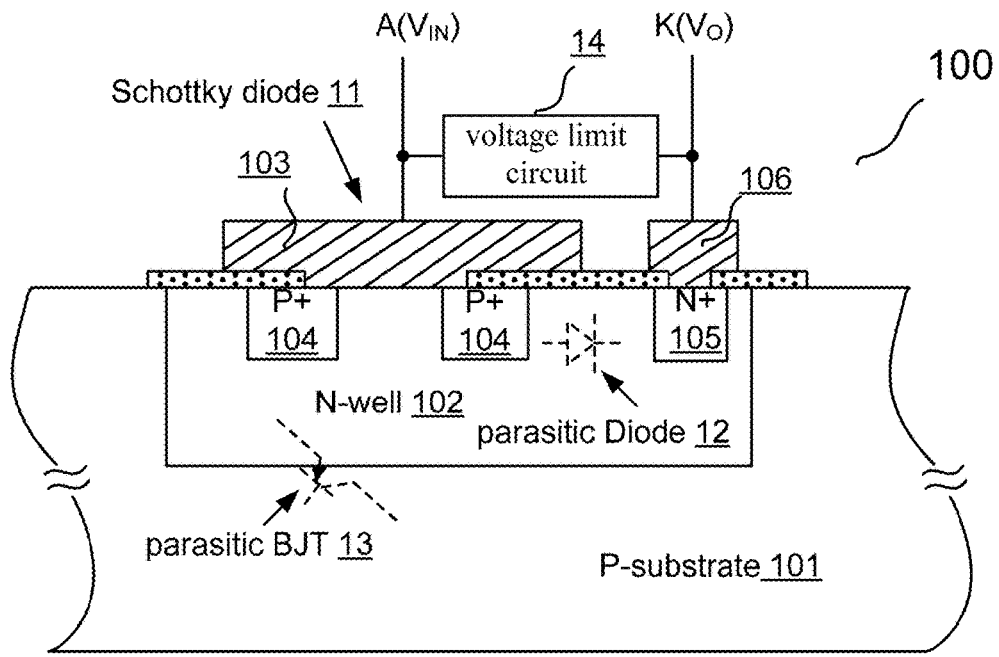
FIG. 1 illustrates a sectional view of an electronic device 100 comprising a Schottky diode in accordance with an embodiment of the present invention.

FIG. 1 illustrates a cross sectional view of an electronic device 100 comprising a Schottky diode 11 in accordance with an embodiment of the present invention. As shown in FIG. 1, the electronic device 100 may comprise a P-type substrate 101. An N-type well region 102 is formed on the P-type substrate 101, and the Schottky diode 11 is built in the N-type well region 102. Usually, other elements, e.g., transistors, and control circuits etc., sharing the same P-type substrate 101 with the Schottky diode 11 may also be formed.

The Schottky diode 11 may comprise an anode metal layer 103 and a cathode region sharing the N-type well region 102. The anode metal layer 103 and the N-type well region 102 may form a Schottky contact. An N+ heavily doped region 105 near the top surface of the N-type well region 102 may be formed. The N+ heavily doped region 105 may be configured to function as an ohmic contact of the cathode region of the Schottky diode 11. An anode electrode (A) may be led out from the anode metal layer 103. A cathode electrode (K) may be led out from a cathode metal layer 106 formed on the N+ heavily doped region 105.

In an embodiment, the Schottky diode 11 may further comprise P+ heavily doped regions 104 located on both sides of the Schottky diode 11. The P+ heavily doped regions 104 and the N-type well region 102 may be used to form a parasitic PN diode 12 which can reduce a reverse leakage current of the Schottky diode 11, wherein the P+ heavily doped regions 104 operate as an anode of the parasitic PN diode 12 and the N-type well region 102 operates as a cathode of the parasitic PN diode 12. However, the P+ heavily doped regions 104, the N-type well region 102 and the P-type substrate 101 can also form a parasitic bipolar junction transistor (BJT) 13, wherein the P+ heavily doped regions 104 operate as an emitter of the BJT 13, the N-type well region 102 operates as a base of the BJT 13 and the P-type substrate 101 operates as a collector of the BJT 13.

As can be appreciated, a base-emitter voltage of the parasitic BJT 13 is also a forward voltage ($V_D$) of the parasitic PN diode 12, a collection current of the parasitic BJT 13 is considered to be a substrate injection current ($I_S$) injected into the P-type substrate 101 of the electronic device 100, and the collection current of the parasitic BJT 13 is an exponential function of the base-emitter voltage of the parasitic BJT 13. Thus, the parasitic BJT 13 may operate once the parasitic PN diode 12 is turned on. Specifically, the substrate injection current ($I_S$) increases exponentially with the increasing of the forward voltage ($V_D$) of the parasitic PN diode 12 once the parasitic PN diode 12 is turned on.

In the illustrated embodiment of FIG. 1, the electronic device 100 may further comprise a voltage limit circuit 14. The voltage limit circuit 14 may be configured to limit the forward voltage ($V_D$) between a forward conduction threshold voltage ($V_{TH1}$) of the Schottky diode 11 and a forward conduction threshold voltage ($V_{TH2}$) of the parasitic PN diode 12. In one embodiment, the forward conduction threshold voltage ($V_{TH1}$) of the Schottky diode 11 is smaller than the forward conduction threshold voltage ($V_{TH2}$) of the parasitic PN diode 12. Typically, the forward conduction threshold voltage ($V_{TH1}$) of the Schottky diode 11 has a voltage value of 0.2V, and the forward conduction threshold voltage ($V_{TH2}$) of the parasitic PN diode 12 has a voltage value of 0.7V.

The embodiments of the present invention are intended to limit and possibly eliminate the substrate current ($I_S$) injected into the substrate by limiting the forward voltage ($V_D$) of the Schottky diode 11. Specifically, if the forward voltage ($V_D$) of the Schottky diode 11 is limited between the forward conduction threshold voltage ($V_{TH1}$) of the Schottky diode 11 and the forward conduction threshold voltage ($V_{TH2}$) of the parasitic PN diode 12, the Schottky diode 11 turns on and the parasitic PN diode 12 keeps off. Thus, the parasitic BJT 13 will not be turned on so that no charges inject to the substrate through the parasitic BJT 13.

In order to get the most current carrying capacity of a Schottky diode with a given size, the maxim value of the forward voltage ($V_D$) of the Schottky diode 11 can be set at slightly less than the forward conduction threshold voltage ($V_{TH2}$) of the parasitic PN diode 12. In one embodiment, the forward voltage ($V_D$) of the Schottky diode 11 is larger than 85% of the forward conduction threshold voltage ($V_{TH2}$) of the parasitic PN diode 12, and smaller than the forward conduction threshold voltage ($V_{TH2}$) of the parasitic PN diode 12, e.g. 0.65V.

Figure 2:
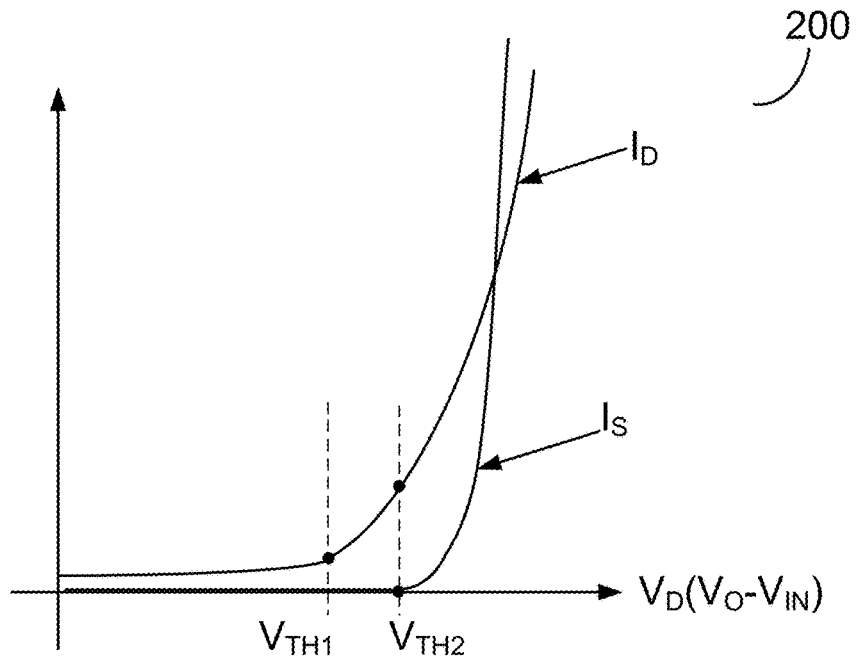
FIG. 2 shows a diagram 200 illustrating forward current flowing through the Schottky diode and substrate injection current as a function of a forward voltage of the Schottky diode of FIG. 1.

FIG. 2 shows a diagram illustrating forward current ($I_D$) flowing through the Schottky diode 11 and substrate injection current ($I_S$) as a function of a forward voltage ($V_D$) of the Schottky diode 11 of FIG. 1. In the illustrated embodiment of FIG. 1, the anode electrode (A) of the Schottky diode 11 may be configured to receive an input voltage signal ($V_{IN}$), and the cathode electrode (K) of the Schottky diode 11 outputs an output voltage ($V_O$). Thus, the forward voltage ($V_D$) of the Schottky diode 11 is equal to $V_{IN}-V_O$. As shown in FIG. 2, when the forward voltage ($V_D$) of the Schottky diode 11 is larger than the forward conduction threshold voltage ($V_{TH1}$) of the Schottky diode 11, the Schottky diode 11 turns on and the forward current ($I_D$) flows through the Schottky diode 11. As the forward voltage ($V_D$) of the Schottky diode 11 increases further, the parasitic PN diode 12 turns on once the forward voltage ($V_D$) of the Schottky diode 11 becomes larger than the forward conduction threshold voltage ($V_{TH2}$) of the parasitic PN diode 12.

Figure 3:
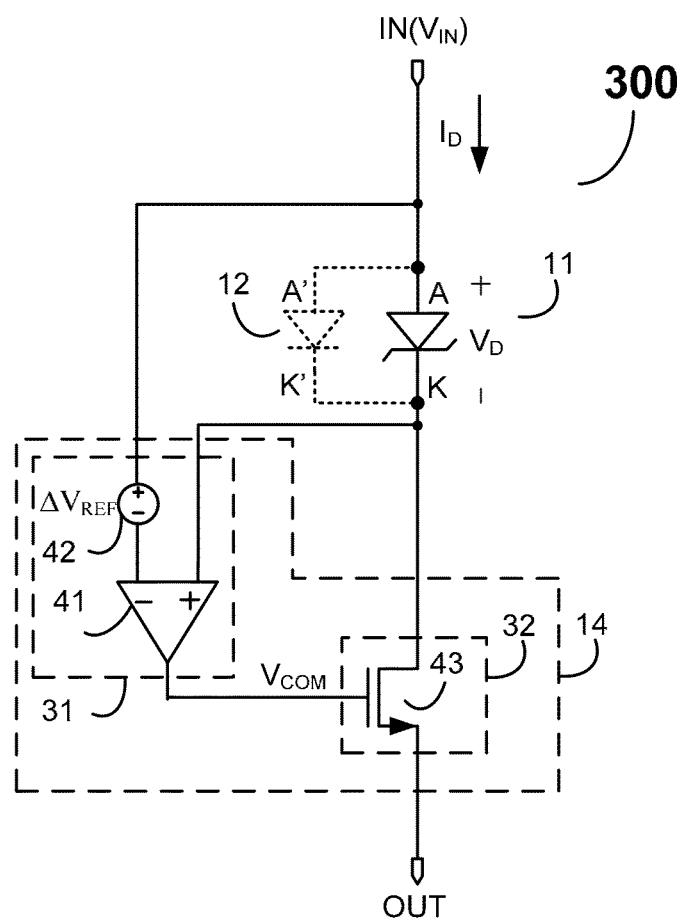
FIG. 3 schematically illustrates an electronic device 300 according to an embodiment of the present invention.

FIG. 3 schematically illustrates an electronic device 300 according to an embodiment of the present invention. As shown in FIG. 3, the electronic device 300 may comprise a Schottky diode 11 having an anode electrode (A) and a cathode electrode (K), a parasitic PN diode 12 having an anode electrode (A') and a cathode electrode (K') coexisted with the Schottky diode 11 in parallel, i.e. the anode electrode (A') of the parasitic PN diode 12 and the anode electrode (A) of Schottky diode 11 may be connected together, and the cathode electrode (K') of the parasitic PN diode 12 and the cathode electrode (K) of Schottky diode 11 may be connected together. The electronic device 300 may comprise a semiconductor substrate, in which the Schottky diode 11 and the parasitic PN diode 12 are formed. Usually, other elements, e.g., transistors, and control circuits etc., sharing the same semiconductor substrate with the Schottky diode 11 and the parasitic PN diode 12 may also be formed. Therefore, a parasitic BJT may be generated as described above with reference of FIG. 1 (e.g. the parasitic BJT 13 of FIG. 1) due to the exiting of the parasitic PN diode 12.

The Schottky diode 11 may be coupled between an input terminal (IN) and an output terminal (OUT), wherein the anode electrode (A) of the Schottky diode 11 and the anode electrode (A') of the parasitic PN diode 12 may be coupled together to the input terminal (IN) for receiving an input voltage ($V_{IN}$).

In one embodiment, the electronic device 300 may further comprise a voltage limit circuit 14, wherein the voltage limit circuit 14 may be configured to limit the forward voltage ($V_D$) of the Schottky diode 11 in a range, which is larger than the forward conduction threshold voltage ($V_{TH1}$) of the Schottky diode 11 and smaller than the forward conduction threshold voltage ($V_{TH2}$) of the parasitic PN diode 12. In one embodiment, the forward conduction threshold voltage ($V_{TH1}$) of the Schottky diode 11 is smaller than the forward conduction threshold voltage ($V_{TH2}$) of the parasitic PN diode 12. Generally, a typical voltage value of the forward conduction threshold voltage ($V_{TH1}$) of the Schottky diode 11 is 0.2V, and a typical voltage value of the forward conduction threshold voltage ($V_{TH2}$) of the parasitic PN diode 12 is 0.7V.

In one embodiment, the Schottky diode 11 may turn on once the forward voltage ($V_D$) of the Schottky diode 11 is larger than the forward conduction threshold voltage ($V_{TH1}$) of the Schottky diode 11. After the Schottky diode 11 turns on, the forward current ($I_D$) may flow through the Schottky diode 11 from the anode electrode (A) of the Schottky diode 11 to the cathode electrode (K) of the Schottky diode 11. The voltage limit circuit 14 may comprise an amplifying circuit 31 and a transistor 32. The amplifying circuit 31 may be coupled between the anode electrode (A) and the cathode electrode (K) of the Schottky diode 11. The amplifying circuit 31 may be configured to amplify a difference between the forward voltage ($V_D$) of the Schottky diode 11 and a reference value $\Delta V_{REF}$ to provide an error signal (Vcom). The transistor 32 may be configured to regulate the forward current ($I_D$) flowing through the Schottky diode 11 based on the error signal (Vcom). In one embodiment, the reference value $\Delta V_{REF}$ may be limited in a range, which is larger than the forward conduction threshold voltage ($V_{TH1}$) of the Schottky diode 11, and smaller than the forward conduction threshold voltage ($V_{TH2}$) of the parasitic PN diode 12. In one embodiment, the reference value $\Delta V_{REF}$ may be limited between 0.2V-0.7V. In one embodiment, a typical value of the reference value $\Delta V_{REF}$ is limited to 0.65V.

In the illustrated embodiment of FIG. 3, the amplifying circuit 31 may comprise a reference source 42 having a positive terminal and a negative terminal. The reference source 42 may provide the reference value $\Delta V_{REF}$, wherein the reference value $\Delta V_{REF}$ is limited in a range, which is larger than the forward conduction threshold voltage ($V_{TH1}$) of the Schottky diode 11, and smaller than the forward conduction threshold voltage ($V_{TH2}$) of the parasitic PN diode 12. The positive terminal of the reference source 42 may be coupled to the anode electrode (A) of the Schottky diode 11.

The amplifying circuit 31 may further comprise an amplifier 41 having an inverting input terminal, a non-inverting input terminal and an output terminal, wherein the inverting input terminal may be coupled to the negative terminal of the reference source 42, the non-inverting input terminal may be coupled to the cathode electrode (K) of the Schottky diode 11, and the amplifier 41 may be configured to amplify the difference between the forward voltage ($V_D$) of the Schottky diode 11 and the reference value $\Delta V_{REF}$ of the reference source 42, and further configured to provide the error signal ($V_{COM}$) at the output terminal.

In one embodiment, the transistor 32 may comprise a MOSFET 43 having a source, a drain and a gate. The source of the MOSFET 43 is connected to an output terminal OUT. In one embodiment, the output terminal OUT may comprise a logic ground. The drain of the MOSFET 43 may be coupled to the cathode electrode (K) of the Schottky diode 11. The gate of the MOSFET 43 may be coupled to the output terminal of the amplifier 41 for receiving the error signal ($V_{COM}$). In another embodiment, the power switch 101 may comprise other suitable semiconductor device, e.g. a P-type MOSFET, an N-type JFET, a P-type JFET and so on.

Figure 4:
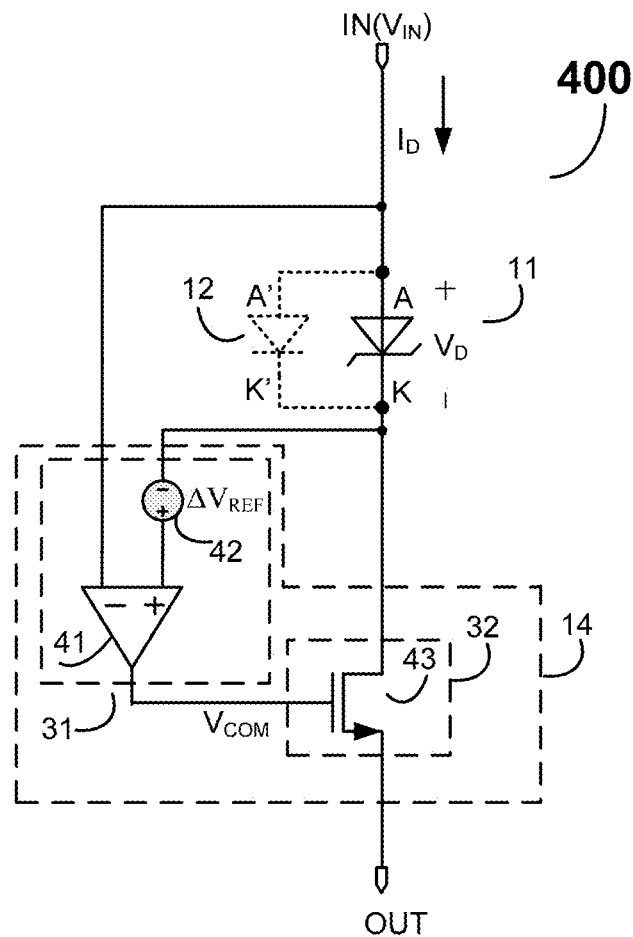
FIG. 4 schematically illustrates an electronic device 400 according to an embodiment of the present invention.

FIG. 4 schematically illustrates an electronic device 400 according to an embodiment of the present invention. As shown in FIG. 4, comparing to the electronic device 300 of FIG. 3, the electronic device 400 of FIG. 4 has a different connection relationship of the amplifying circuit 31.

Specifically, the negative terminal of the reference source 42 may be coupled to the cathode electrode (K) of the Schottky diode 11, the positive terminal of the reference source 42 may be coupled to the non-inverting input terminal of the amplifier 41, and the inverting input terminal of the amplifier 41 may be coupled to the anode electrode (A) of the Schottky diode 11. The amplifier 41 may be configured to amplify the difference between the forward voltage ($V_D$) of the Schottky diode 11 and the reference value $\Delta V_{REF}$ of the reference source 42 to provide the error signal ($V_{COM}$) at the output terminal.

In one embodiment, the Schottky diode 11 may turn on once the forward voltage ($V_D$) of the Schottky diode 11 is larger than the forward conduction threshold voltage ($V_{TH1}$) of the Schottky diode 11. After the Schottky diode 11 turns on, the forward current ($I_D$) may flow through the Schottky diode 11 from the anode electrode (A) of the Schottky diode 11 to the cathode electrode (K) of the Schottky diode 11. The amplifying circuit 31 may be configured to amplify the difference between the forward voltage ($V_D$) of the Schottky diode 11 and the reference value $\Delta V_{REF1}$ of the reference source 42 to provide an error signal ($V_{COM}$) at the output terminal. The transistor 32 may be configured to regulate the forward current ($I_D$) flowing through the Schottky diode 11 based on the error signal ($V_{COM}$) so as to limit the forward voltage ($V_D$) of the Schottky diode 11 to the reference value $\Delta V_{REF}$.

Figure 5:
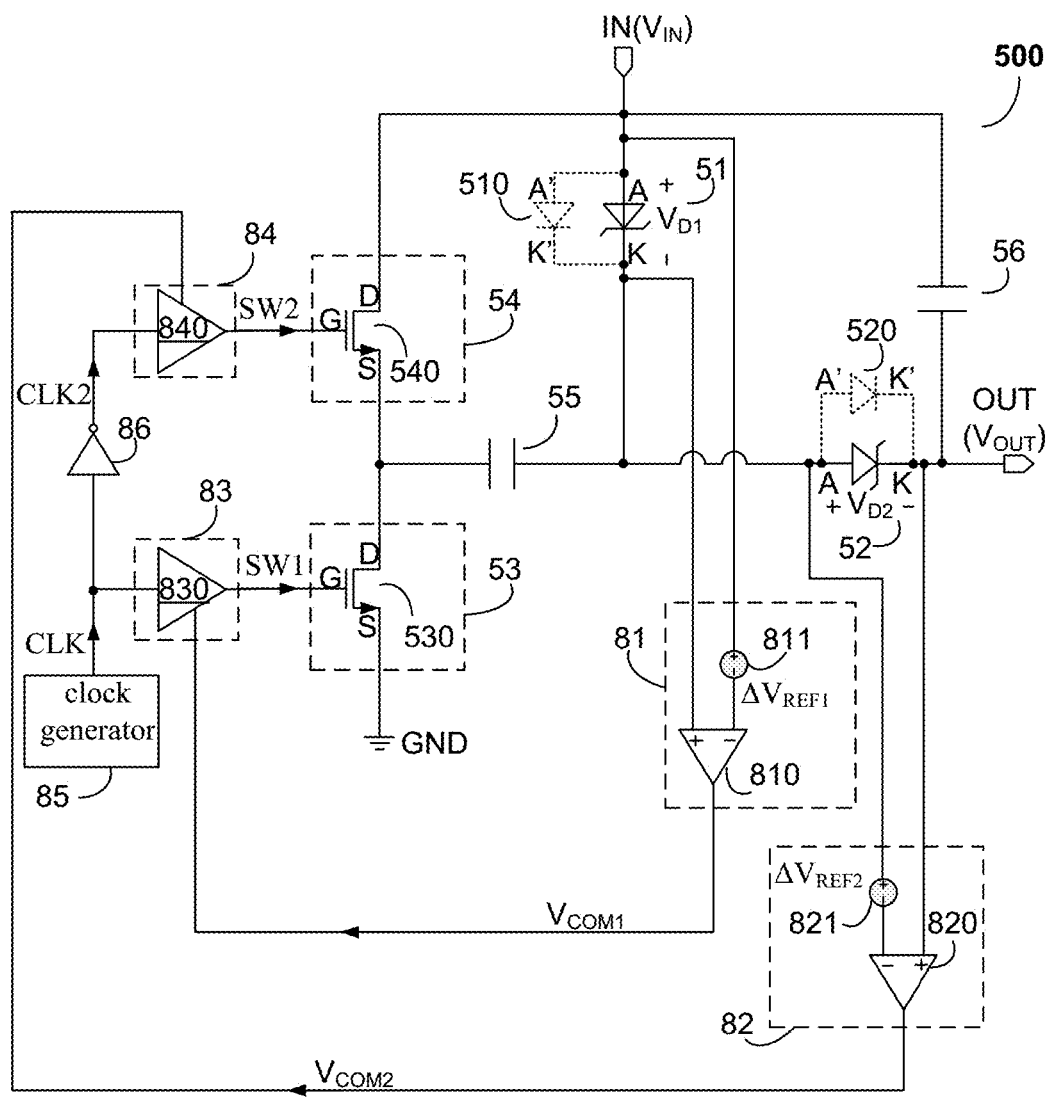
FIG. 5 schematically illustrates an electronic device 500 according to an embodiment of the present invention.

FIG. 5 schematically illustrates an electronic device 500 according to an embodiment of the present invention. In the embodiment of the FIG. 5, the electronic device 500 may comprise a first Schottky diode 51 and a second Schottky diode 52, wherein both the first Schottky diode 51 and the second Schottky diode 52 are formed in a semiconductor substrate. The first Schottky diode 51 may have a forward voltage ($V_{D1}$) between an anode electrode (A) and a cathode electrode (K). The second Schottky diode 52 may have a forward voltage ($V_{D2}$) between an anode electrode (A) and a cathode electrode (K). In the exemplary embodiment of FIG. 5, the electronic device 500 may further comprise a first parasitic PN diode 510 having an anode electrode (A') and a cathode electrode (K') and a second parasitic PN diode 520 having an anode electrode (A') and a cathode electrode (K') formed in the semiconductor substrate, wherein the first parasitic PN diode 510 may be connected to the first Schottky diode 51 in parallel, i.e. the anode electrode (A') of the parasitic PN diode 510 and the anode electrode (A) of Schottky diode 51 may be connected together, and the cathode electrode (K') of the parasitic PN diode 510 and the cathode electrode (K) of Schottky diode 51 may be connected together, and wherein the second parasitic PN diode 520 may be connected to the second Schottky diode 52 in parallel, i.e. the anode electrode (A') of the parasitic PN diode 520 and the anode electrode (A) of Schottky diode 52 may be connected together, and the cathode electrode (K') of the parasitic PN diode 520 and the cathode electrode (K) of Schottky diode 52 may be connected together.

Furthermore, the electronic device 500 may further comprise a control circuit configured to limit the forward voltage ($V_{D1}$) of the first Schottky diode 51 in a range, which is larger than a forward conduction threshold voltage ($V_{TH1-1}$) of the first Schottky diode 51, and smaller than a forward conduction threshold voltage ($V_{TH2-1}$) of the first parasitic PN diode 510. The electronic device 500 may further configured to limit the forward voltage ($V_{D2}$) of the second Schottky diode 52 in a range, which is larger than a forward conduction threshold voltage ($V_{TH1-2}$) of the second Schottky diode 52, and smaller than a forward conduction threshold voltage ($V_{TH2-2}$) of the second parasitic PN diode 520.

In the embodiment of the FIG. 5, the electronic device 500 may be a charge pump circuit. The electronic device 500 may further comprise a first power switch 53 having a first terminal, a second terminal and a control terminal; a second power switch 54 having a first terminal, a second terminal and a control terminal; a first capacitor 55 having a first terminal and a second terminal; and a second capacitor 56 having a first terminal and a second terminal, wherein the charge pump circuit may be configured to convert an input voltage ($V_{IN}$) to an output voltage ($V_{OUT}$).

The first terminal of the first power switch 53 may be coupled to a common node of the second terminal of the second power switch 54 and the second terminal of the first capacitor 55; the second terminal of the first power switch 53 is connected to a logic ground; the control terminal of the first power switch 53 may be configured to receive a first control signal (SW1) for controlling the first power switch 53. The first terminal of the second power switch 54 may be coupled to an input terminal (IN) of the electronic device 500 to receive an input voltage signal ($V_{IN}$); the control terminal of the second power switch 54 may be configured to receive a second control signal (SW2) for controlling the second power switch 54. The anode electrode (A) of the first Schottky diode 51 may be coupled to the input terminal (IN) of the electronic device 500 to receive the input voltage signal ($V_{IN}$); the cathode electrode (K) of the first Schottky diode 51 may be coupled to a common node of the first terminal of the first capacitor 55 and the anode electrode (A) of the second Schottky diode 52. The cathode electrode (K) of the second Schottky diode 52 may be coupled to an output terminal (OUT) of the electronic device 500. The first terminal of the second capacitor 56 may be coupled to the output terminal (OUT) of the electronic device 500 to provide an output voltage ($V_{OUT}$); the second terminal of the second capacitor 56 may be coupled to the input terminal (IN) of the electronic device 500.

In the embodiment of FIG. 5, the electronic device 500 may be configured to provide the output voltage signal ($V_{OUT}$) which is larger than the input voltage signal ($V_{IN}$) by controlling the first power switch 53 and the second power switch 54 to operate complementarily. The first control signal (SW1) and the second control signal (SW2) may have an active state and an inactive state respectively. In the exemplary embodiment of FIG. 5, the active state is indicative of being operate in a linear region of a power switch (e.g., the first power switch 53 and the second power switch 54), and the inactive state is indicative of turning off of a power switch (e.g., the first power switch 53 and the second power switch 54). In one embodiment, when the first control signal (SW1) is in the active state and the second control signal (SW2) is in the inactive state, the first power switch 53 operates in a linear region and the second power switch 54 is turned off so that the first capacitor 55 is charged by the input voltage ($V_{IN}$) through the first Schottky diode 53. When the first control signal (SW1) is in the inactive state and the second control signal (SW2) is in the active state, the first power switch 53 is turned off and the second power switch 54 operates in a linear region so that the charges stored in the first capacitor 55 may be transferred to the second capacitor 56 through the second Schottky diode 52. Repeating this operation, the output voltage ($V_{OUT}$) will be charged to higher than the input voltage signal ($V_{IN}$).

The control circuit may comprise a first amplifying circuit 81 coupled between the anode electrode (A) and the cathode electrode (K) of the first Schottky diode 51. The first amplifying circuit 81 may be configured to amplify a difference between the forward voltage ($V_{D1}$) of the first Schottky diode 51 and a first reference value $\Delta V_{REF1}$ to provide a first error signal ($V_{COM1}$). In one embodiment, the first reference value $\Delta V_{REF1}$ may be limited in a range, which is larger than the forward conduction threshold voltage ($V_{TH1-1}$) of the first Schottky diode 51, and smaller than the forward conduction threshold voltage ($V_{TH2-1}$) of the first parasitic PN diode 510. In one embodiment, the first reference value $\Delta V_{REF1}$ may be limited to 0.2V-0.7V. In one embodiment, a typical value of the first reference value $\Delta V_{REF1}$ is limited to 0.65V.

The first amplifying circuit 81 may comprise a first amplifier 810 having an inverting input terminal, a non-inverting input terminal and an output terminal, and a first reference source 811 having a positive terminal and a negative terminal. The positive terminal of the first reference source 811 may be coupled to the anode electrode (A) of the first Schottky diode 51. The negative terminal of the first reference source 811 may be coupled to the inverting input terminal of the first amplifier 810. The non-inverting input terminal of the first amplifier 810 may be coupled to the cathode electrode (K) of the first Schottky diode 51. The first reference source 811 may provide the first reference value $\Delta V_{REF1}$. The first amplifier 810 may be configured to amplify the difference between the forward voltage ($V_{D1}$) of the first Schottky diode 51 and the first reference value $\Delta V_{REF1}$ to provide the first error signal ($V_{COM1}$) at the output terminal of the first amplifier 810.

The control circuit may comprise a second amplifying circuit 82 coupled between the anode electrode (A) and the cathode electrode (K) of the second Schottky diode 52. The second amplifying circuit 82 may be configured to amplify a difference between the forward voltage ($V_{D2}$) of the second Schottky diode 52 and a second reference value $\Delta V_{REF2}$ to provide a second error signal ($V_{COM2}$). In one embodiment, the second reference value $\Delta V_{REF2}$ may be limited in a range, which is larger than the forward conduction threshold voltage ($V_{TH1-2}$) of the second Schottky diode 52, and smaller than the forward conduction threshold voltage ($V_{TH2-2}$) of the second parasitic PN diode 520. In one embodiment, the second reference value $\Delta V_{REF2}$ may be limited to 0.2V-0.7V. In one embodiment, a typical value of the second reference value $\Delta V_{REF2}$ is limited to 0.65V.

The second amplifying circuit 82 may comprise a second amplifier 820 having an inverting input terminal, a non-inverting input terminal and an output terminal, and a second reference source 821 having a positive terminal and a negative terminal. The positive terminal of the second reference source 821 may be coupled to the anode electrode (A) of the second Schottky diode 52. The negative terminal of the second reference source 821 may be coupled to the inverting input terminal of the second amplifier 820. The non-inverting input terminal of the second amplifier 820 may be coupled to the cathode electrode (K) of the second Schottky diode 52. The second reference source 821 may provide the second reference value $\Delta V_{REF2}$. The second amplifier 820 may be configured to amplify the difference of the forward voltage of the second Schottky diode 52 and the second reference value $\Delta V_{REF2}$ to provide the second error signal ($V_{COM2}$) at the output terminal of the second amplifier 820.

In one embodiment, the first reference source 811 and the second reference source 821 may have a same value, i.e., the first reference value $\Delta V_{REF1}$ is equal to the second reference value $\Delta V_{REF2}$. In another embodiment, for example, the first Schottky diode 51 and the second Schottky diode 52 are two different Schottky diodes, the first reference source 811 and the second reference source 821 may have two different values in accordance with the requirement of these two different Schottky diodes.

In one embodiment, the control circuit may further comprise a first multiplex circuit 83, a second multiplex circuit 84, a clock generator 85 and an inverter 86.

The clock generator 85 may be configured to generate a clock signal (CLK). The inverter 86 may has an input terminal and an output terminal. The inverter 86 may be configured to receive the clock signal (CLK) at the input terminal, and further configured to invert the clock signal (CLK) so as to provide an inverse clock signal (CLK2) at the output terminal.

The first multiplex circuit 83 may have a first input terminal, a second input terminal and an output terminal. The first input terminal of the first multiplex circuit 83 may be coupled to the clock generator 85 to receive the clock signal (CLK). The second input terminal of the first multiplex circuit 83 may be configured to receive the first error signal ($V_{COM1}$). The first multiplex circuit 83 may be configured to provide the first control signal (SW1) at the output terminal based on the clock signal (CLK) and the first error signal ($V_{COM1}$). The output terminal of the first multiplex circuit 83 may be coupled to the control terminal of the first power switch 53. The first control signal (SW1) may be configured to control the first power switch 53. In one embodiment, when the first power switch 53 is in the active state, the first control signal (SW1) may be configured to regulate the current flowing through the first terminal and the second terminal of the first power switch 53. In one embodiment, the first control signal (SW1) may be configured to regulate the current flowing through the first power switch 53 based on the first error signal ($V_{COM1}$) once a rising edge of the clock signal (CLK) arrives, and further configured to turn the first power switch 53 off when the falling edge of the clock signal (CLK) arrives. During this time, the current flowing through the first Schottky diode 51 can be regulated, and the forward voltage ($V_{D1}$) across the first Schottky diode 51 can be limited to the first reference value $\Delta V_{REF1}$. Meanwhile, the first capacitor 55 can be charged through the first Schottky diode 51 and the first power switch 53. In another embodiment, the first control signal (SW1) may be configured to regulate the current flowing through the first power switch 53 based on the first error signal ($V_{COM1}$) once the falling edge of the clock signal (CLK) arrives, and further configured to turn the first power switch 53 off when the rising edge of the clock signal (CLK) arrives.

In one embodiment, the first multiplex circuit 83 may comprise a buffer 830 having an input terminal, a supply terminal and an output terminal. The input terminal of the buffer 830 operated as the first input terminal of the first multiplex circuit 83 may be configured to receive the clock signal (CLK). The supply terminal of the buffer 830 operated as the second input terminal of the first multiplex circuit 83 may be configured to receive the first error signal ($V_{COM1}$). The output terminal buffer 830 operated as the output terminal of the first multiplex circuit 83 may be configured to provide the first control signal (SW1) to the control terminal of the first power switch 53.

The second multiplex circuit 84 may have a first input terminal, a second input terminal and an output terminal. The first input terminal of the second multiplex circuit 84 may be coupled to the output terminal of the inverter 86 to receive the inverse clock signal (CLK2). The second input terminal of the second multiplex circuit 84 may be configured to receive the second error signal ($V_{COM2}$). The second multiplex circuit 84 may be configured to provide the second control signal (SW2) at the output terminal based on the clock signal (CLK) and the second error signal ($V_{COM2}$). The output terminal of the second multiplex circuit 84 may be coupled to the control terminal of the second power switch 54. The second control signal (SW2) may be configured to control the second power switch 54. In one embodiment, when the second power switch 54 is in the active state, the second control signal (SW2) may be configured to regulate the current flowing through the first terminal and the second terminal of the second power switch 54. In one embodiment, the second control signal (SW2) may be configured to regulate the current flowing through the second power switch 54 based on the second error signal ($V_{COM2}$) once the rising edge of the inverse clock signal (CLK2) arrives, and further configured to turn the second power switch 54 off when the falling edge of the inverse clock signal (CLK2) arrives. During this time, the current flowing through the second Schottky diode 52 can be regulated, and the forward voltage ($V_{D2}$) across the second Schottky diode 52 can be limited to the second reference value $\Delta V_{REF2}$. Meanwhile, the second capacitor 56 can be charged through the second Schottky diode 52 and the second power switch 54. In another embodiment, the second control signal (SW2) may be configured to regulate the current flowing through the second power switch 54 based on the second error signal ($V_{COM2}$) once the falling edge of the inverse clock signal (CLK2) arrives, and further configured to turn the second power switch 54 off when the rising edge of the inverse clock signal (CLK2) arrives.

In one embodiment, the second multiplex circuit 84 may comprise a buffer 840 having an input terminal, a supply terminal and an output terminal. The input terminal of the buffer 840 operated as the first input terminal of the second multiplex circuit 84 may be configured to receive the inverse clock signal (CLK2). The supply terminal of the buffer 840 operated as the second input terminal of the second multiplex circuit 84 may be configured to receive the second error signal ($V_{COM2}$). The output terminal buffer 840 operated as the output terminal of the second multiplex circuit 84 may be configured to provide the second control signal (SW2) to the control terminal of the second power switch 54.

In one embodiment, the first power switch 53 may comprise an N-type MOSFET 530 having a drain (D), a source (S) and a gate (G), wherein the drain (D) of N-type MOSFET 530 may be configured to operate as the first terminal of the first power switch 53, the source (S) of the N-type MOSFET 530 may be configured to operate as the second terminal of the first power switch 54, and the gate (G) of the N-type MOSFET 530 may be configured to operate as the control terminal of the first power switch 53.

In one embodiment, the second power switch 54 may comprise an N-type MOSFET 540 having a drain (D), a source (S) and a gate (G), wherein the drain (D) of N-type MOSFET 540 may be configured to operate as the first terminal of the second power switch 54, the source (S) of the N-type MOSFET 540 may be configured to operate as the second terminal of the second power switch 54, and the gate (G) of the N-type MOSFET 540 may be configured to operate as the control terminal of the second power switch 54.

Figure 6:
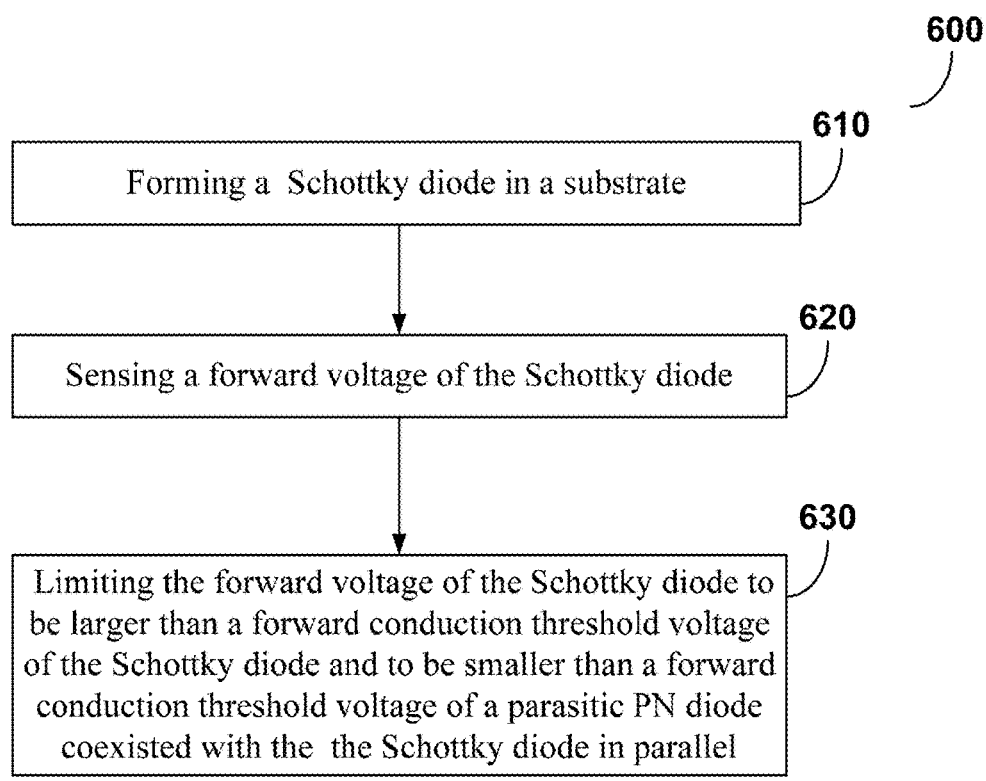
FIG. 6 shows a method 600 for eliminating a substrate injection current of an electronic device in accordance with one embodiment of the present invention.

FIG. 6 shows a method 600 for eliminating a substrate injection current of an electronic device in accordance with one embodiment of the present invention. The method 600 may comprises steps 610-620.

At step 610, forming a Schottky diode in a semiconductor substrate. In the illustrated embodiment of FIG. 6, the electronic device may comprise a semiconductor substrate. In one embodiment, a Schottky diode and a parasitic PN diode may be formed in the semiconductor substrate, wherein the parasitic PN diode is coexisted with the Schottky diode in parallel, for example, in FIGS. 3-4, a Schottky diode 11 and a parasitic PN diode 12 may be formed in a semiconductor substrate, and the parasitic PN diode 12 is coexisted with the Schottky diode 11 in parallel, i.e., the anode electrode (A') of the parasitic PN diode 12 and the anode electrode (A) of Schottky diode 11 may be connected together, and the cathode electrode (K') of the parasitic PN diode 12 and the cathode electrode (K) of Schottky diode 11 may be connected together. In another embodiment, two Schottky diodes and two parasitic PN diodes may be formed in the semiconductor substrate, for example, in FIG. 5, two Schottky diodes 51, 52 and two parasitic PN diodes 510, 520 may be formed in a semiconductor substrate. The parasitic PN diode 510 is coexisted with the Schottky diode 51 in parallel, and the parasitic PN diode 520 is coexisted with the Schottky diode 52 in parallel, i.e., the anode electrode (A') of the parasitic PN diode 510 and the anode electrode (A) of Schottky diode 51 may be connected together, and the cathode electrode (K') of the parasitic PN diode 510 and the cathode electrode (K) of Schottky diode 51 may be connected together; and the anode electrode (A') of the parasitic PN diode 520 and the anode electrode (A) of Schottky diode 52 may be connected together, and the cathode electrode (K') of the parasitic PN diode 520 and the cathode electrode (K) of Schottky diode 52 may be connected together. As can be appreciated, the number of the Schottky diode and the corresponding parasitic PN diode formed in the semiconductor substrate may not be limited to one or two, and it can be chose in accordance with the requirement of different applications. In one embodiment, a forward conduction threshold voltage of the Schottky diode is smaller than a forward conduction threshold voltage of the corresponding parasitic PN diode. Typically, the forward conduction threshold voltage of the Schottky diode has a voltage value of 0.2V, and the forward conduction threshold voltage of the parasitic PN diode has a voltage value of 0.7V.

At step 620, sensing forward voltage of each of the at least one Schottky diode;

At step 630, limiting the forward voltage of each of the at least one Schottky diode to be larger than the forward conduction threshold voltage of the corresponding Schottky diode, and to be smaller than the forward conduction threshold voltage of the parasitic PN diode. In order to getting the most current carrying capacity of a Schottky diode with a given size, the maxim value of forward voltage of the Schottky diode can be set at slightly less than the forward conduction threshold voltage of the parasitic PN diode. In one embodiment, the forward voltage of the Schottky diode is larger than 85% of the forward conduction threshold voltage of the parasitic PN diode, and smaller than the forward conduction threshold voltage of the parasitic PN diode, e.g., 0.65V.

It should be noted that the ordinary skill in the art should know that the power conversion module and the power conversion circuit presented in this invention not only limited in a topology, but also in other large applications needed. Similarly, the circuit, controller etc. presented in this invention only used to schematically show as an example.

While various embodiments have been described above, it should be understood that they have been presented by way of example only, and not limitation. Thus, the breadth and scope of a prefV1ed embodiment should not be limited by any of the above-described exemplary embodiments, but should be defined only in accordance with the following claims and their equivalents.

I claim:

1. An electronic device, comprising:
a semiconductor substrate;
a Schottky diode, formed in the semiconductor substrate;
a parasitic PN diode, formed in the semiconductor substrate, wherein the parasitic PN diode and the Schottky diode are in parallel;
an amplifying circuit, coupled between an anode and a cathode of the Schottky diode, configured to amplify a difference value of the forward voltage of the Schottky diode and a reference signal, and further configured to provide an error signal, wherein a value of the reference signal is larger than the forward conduction threshold voltage of the Schottky diode, and smaller than the forward conduction threshold voltage of the parasitic PN diode; and
a transistor, configured to regulate the current flowing through the Schottky diode based on the error signal.

2. The electronic device of claim 1, wherein the voltage limit circuit is configured to limit the forward voltage of the Schottky diode to be larger than 85% of the forward conduction threshold voltage of the parasitic PN diode, and to be smaller than the forward conduction threshold voltage of the parasitic PN diode.

3. The electronic device of claim 1, wherein the forward voltage of the Schottky diode is limited to 0.65V.

4. The electronic device of claim 1, wherein the amplifying circuit comprises:
a reference source configured to provide the reference signal, wherein the reference source has a positive terminal coupled to the anode of the Schottky diode, and a negative terminal; and
an amplifier having an inverting input terminal, a non-inverting input terminal and an output terminal, wherein the inverting input terminal is coupled to the negative terminal of the reference source, the non-inverting input terminal is coupled to the cathode of the Schottky diode, the amplifier is configured to amplify the difference of the forward voltage of the Schottky diode and the reference signal, and further configured to provide the error signal at the output terminal; and wherein
the transistor has a source, a drain and a gate, the source is connected to a logic ground, the drain is coupled to the cathode of the Schottky diode, and the gate is coupled to the output terminal of the amplifier for receiving the error signal.

5. An electronic device, comprising:
a semiconductor substrate;
a first Schottky diode, formed in the semiconductor substrate;
a second Schottky diode, formed in the semiconductor substrate;
a first parasitic PN diode, formed in the semiconductor substrate, wherein the first parasitic PN diode and the first Schottky diode are in parallel;
a second parasitic PN diode, formed in the semiconductor substrate, wherein the second parasitic PN diode and the second Schottky diode are in parallel;
a first power switch having a first terminal, a second terminal and a control terminal;
a second power switch having a first terminal, a second terminal and a control terminal;
a first capacitor having a first terminal and a second terminal;
a second capacitor having a first terminal and a second terminal; wherein
the first terminal of the first power switch is coupled to the second terminal of the second power switch and the second terminal of the first capacitor, the second terminal of the first power switch is connected to a logic ground; the first terminal of the second power switch is coupled to an input terminal of the electronic device to receive an input voltage signal; an anode of the first Schottky diode is coupled to the input terminal of the electronic device to receive the input voltage signal, a cathode of the first Schottky diode is coupled to the first terminal of the first capacitor and the anode of the second Schottky diode; the cathode of the second Schottky diode is coupled to the first terminal of the second capacitor to constitute an output terminal of the electronic device to provide an output voltage; the second terminal of the second capacitor is coupled to the input terminal of the electronic device; and wherein the first power switch and the second power switch are operated complementarily;

a first amplifying circuit, coupled between the anode and the cathode of the first shottky diode, configured to amplify a difference value of the forward voltage of the first Schottky diode and a first reference signal, and further configured to provide a first error signal at an output terminal of the first amplifying circuit;

a second amplifying circuit, coupled between the anode and the cathode of the second Shottky diode, configured to amplify a difference value of the forward voltage of the second Schottky diode and a second reference signal, and further configured to provide a second error signal at an output terminal of the second amplifying circuit;

a clock generator, configured to generate a clock signal;

an inverter, configured to receive the clock signal, and further configured to invert the clock signal to provide an inverse clock signal;

a first multiplex circuit, configured to receive the clock signal and the first error signal, and further configured to provide a first control signal to the control terminal of the first power switch, wherein when the first power switch is operated, the first control signal is configured to regulate the current flowing through the first terminal and the second terminal of the first power switch; and a second multiplex circuit, configured to receive the inverse clock signal and the second error signal, and further configured to provide a second control signal to the control terminal of the second power switch, wherein when the second power switch is operated, the second control signal is configured to regulate the current flowing through the first terminal and the second terminal of the second power switch; and wherein the value of the first reference signal is limited to be larger than the forward conduction threshold voltage of the first Schottky diode and to be smaller than the forward conduction threshold voltage of the first parasitic PN diode; the value of the second reference signal is limited to be larger than the forward conduction threshold voltage of the second Schottky diode and to be smaller than the forward conduction threshold voltage of the second parasitic PN diode.

6. The electronic device of claim 5, wherein the control circuit is configured to limit the forward voltage of the first Schottky diode to be larger than 85% of the forward conduction threshold voltage of the first parasitic PN diode, and to be smaller than the forward conduction threshold voltage of the first parasitic PN diode.

7. The electronic device of claim 5, wherein the control circuit is configured to limit the forward voltage of the second Schottky diode to be larger than 85% of the forward conduction threshold voltage of the second parasitic PN diode, and to be smaller than the forward conduction threshold voltage of the second parasitic PN diode.

8. The electronic device of claim 5, wherein both the forward voltage of the first Schottky diode and the forward voltage of the second Schottky diode are limited to 0.65V.

9. The electronic device of claim 5, wherein the first amplifying circuit comprises:

a first reference source configured to provide the first reference signal, wherein the reference source has a positive terminal coupled to the anode of the Schottky diode, and a negative terminal; and a first amplifier having an inverting input terminal, a non-inverting input terminal and an output terminal, the inverting input terminal of the first amplifier is coupled to the negative terminal of the first reference source, the non-inverting input terminal of the first amplifier is coupled to the cathode of the first Schottky diode, the first amplifier is configured to amplify the difference of the forward voltage and the first reference signal, and further configured to provide the first error signal at the output terminal of the first amplifier.

10. The electronic device of claim 5, wherein the first multiplex circuit comprises a first buffer having an input terminal, a supply terminal and an output terminal, the input terminal of the first buffer is configured to receive the clock signal, the supply terminal of the first buffer is configured to receive the first error signal, the first buffer is configured to provide the first control signal to the control terminal of the first power switch; and wherein the second multiplex circuit comprises a second buffer having an input terminal, a supply terminal and an output terminal, the input terminal of the second buffer is configured to receive the clock signal, the supply terminal of the second buffer is configured to receive the second error signal, the second buffer is configured to provide the second control signal to the control terminal of the second power switch.

11. The electronic device of claim 5, wherein the second amplifying circuit comprises:

a second reference source configured to provide the second reference signal, wherein the reference source has a positive terminal coupled to the anode of the Schottky diode, and a negative terminal; and a second amplifier having an inverting input terminal, a non-inverting input terminal and an output terminal, the inverting input terminal of the second amplifier is coupled to the negative terminal of the second reference source, the non-inverting input terminal of the second amplifier is coupled to the cathode of the second Schottky diode, the second amplifier is configured to amplify the difference of the forward voltage and the second reference signal, and further configured to provide the second error signal at the output terminal of the second amplifier.

* * * * *